US011424322B2

(12) United States Patent
Nagaoka et al.

(10) Patent No.: US 11,424,322 B2
(45) Date of Patent: Aug. 23, 2022

(54) SEMICONDUCTOR DEVICE AND METHOD OF MANUFACTURING THE SAME (71) Applicants: Tatsuji Nagaoka, Toyota (JP); Hiroyuki Nishinaka, Kyoto (JP); Masahiro Yoshimoto, Kyoto (JP)

(72) Inventors: Tatsuji Nagaoka, Nagakute (JP); Hiroyuki Nishinaka, Kyoto (JP); Masahiro Yoshimoto, Kyoto (JP)

(73) Assignees: DENSO CORPORATION, Kariya (JP); NATIONAL UNIVERSITY CORPORATION KYOTO INSTITUTE OF TECHNOLOGY, Kyoto (JP)

( * ) Notice: Subject to any disclaimer, the term of this patent is extended or adjusted under 35 U.S.C. 154(b) by 0 days.

(21) Appl. No.: 16/784,907

(22) Filed: Feb. 7, 2020

(65) Prior Publication Data
US 2020/0273951 A1 Aug. 27, 2020

(30) Foreign Application Priority Data
Feb. 27, 2019 (JP) .............................. JP2019-033998

(51) Int. Cl.
*H01L 29/06* (2006.01)
*H01L 29/24* (2006.01)
*H01L 21/784* (2006.01)
*H01L 29/872* (2006.01)
*H01L 29/861* (2006.01)

(52) U.S. Cl.
CPC ........ *H01L 29/0692* (2013.01); *H01L 21/784* (2013.01); *H01L 29/24* (2013.01); *H01L 29/8611* (2013.01); *H01L 29/872* (2013.01)

(58) Field of Classification Search
None
See application file for complete search history.

(56) References Cited

U.S. PATENT DOCUMENTS

2007/0134833 A1\* 6/2007 Ikemoto ............ H01L 21/02414
438/33
2016/0260832 A1 9/2016 Oka et al.
2017/0213918 A1\* 7/2017 Sasaki .................. C30B 23/025

FOREIGN PATENT DOCUMENTS

| JP | 2016-164906 A | 9/2016 |
| KR | 10-1415599 B1 | 7/2014 |
| KR | 10-2017-0048482 A | 5/2017 |

OTHER PUBLICATIONS

Lei et al., "Die singulation technologies for advanced packaging: A critical review", J. Vac. Sci. Technol. B 30, 040801 (2012); https://doi.org/10.1116/1.3700230 (Year: 2012).\*

(Continued)

*Primary Examiner* — Vincent Wall
(74) *Attorney, Agent, or Firm* — Sughrue Mion, PLLC (57) ABSTRACT

A semiconductor device may include: a gallium oxide substrate including a first side surface constituted of a (100) plane, a second side surface constituted of a plane other than the (100) plane, and an upper surface; and an electrode in contact with the upper surface, in which the gallium oxide substrate may include: a diode interface constituted of a pn interface or a Schottky interface; and an n-type drift region connected to the electrode via the diode interface, and a shortest distance between the first side surface and the diode interface is shorter than a shortest distance between the second side surface and the diode interface.

5 Claims, 8 Drawing Sheets

(56) References Cited

OTHER PUBLICATIONS https://web.archive.org/web/20161202014735/https://learnabout-electronics.org/Semiconductors/diodes_23.php, Dec. 2, 2016 (Year: 2016).*

D Sherman et al., "From crack deflection to lattice vibrations-macro to atomistic examination of dynamic cleavage fracture", Journal of the Mechanics and Physics of Solids, vol. 52, 2004, pp. 1743-1761(20 Pages Total).

Notice of Final Rejection issued in Korean Application No. 10-2020-0022740; dated Sep. 30, 2021.

Notice of Reason for Refusal issue in Korean Application No. 10-2020-0022740, dated Apr. 21, 2021.

* cited by examiner

SEMICONDUCTOR DEVICE AND METHOD OF MANUFACTURING THE SAME

CROSS-REFERENCE TO RELATED APPLICATION

This application claims priority to Japanese Patent Application No. 2019-033998 filed on Feb. 27, 2019, the contents of which are hereby incorporated by reference into the present application.

TECHNICAL FIELD

The technology disclosed herein relates to a semiconductor device and a method of manufacturing the same.

BACKGROUND

Japanese Patent Application Publication No. 2016-164906 describes a semiconductor device including a gallium oxide substrate.

SUMMARY

When a gallium oxide substrate is diced, crystal defects are formed in a cut surface. When the crystal defects enter into a diode interface (i.e., a pn interface or a Schottky interface) of a semiconductor device, properties of the semiconductor device deteriorate. An appropriate distance thus needs to be ensured between the diode interface and the cut surface. In the meantime, ensuring an excessive long distance between the diode interface and the cut surface would uselessly increase a size of the semiconductor device. The present specification proposes a technology that enables downsizing of a semiconductor device including a gallium oxide substrate, while suppressing entrance of crystal defects into a diode interface.

A semiconductor device disclosed herein may comprise: a gallium oxide substrate comprising a first side surface constituted of a (100) plane, a second side surface constituted of a plane other than the (100) plane, and an upper surface; and an electrode in contact with the upper surface, wherein the gallium oxide substrate comprises: a diode interface constituted of a pn interface or a Schottky interface; and an n-type drift region connected to the electrode via the diode interface, and a shortest distance between the first side surface and the diode interface is shorter than a shortest distance between the second side surface and the diode interface.

In manufacturing of this semiconductor device, dicing is performed along the first and second side surfaces. Therefore, the first and second side surfaces are cut surfaces in the dicing. The gallium oxide substrate tends to cleave on the (100) plane (the first side surface). Therefore, if dicing is performed along the first side surface, crystal defects are less likely to be generated in the cut surface (the first side surface). On the other hand, if dicing is performed along the second side surface, crystal defects are prone to be generated in the cut surface (the second side surface). Accordingly, in this semiconductor device, crystal defects that exist in the first side surface are distributed only in vicinity of the first side surface, whereas crystal defects that exist in the second side surface spread from the second side surface to a deep site. Meanwhile, in this semiconductor device, the shortest distance between the first side surface and the diode interface is shorter than the shortest distance between the second side surface and the diode interface. Since the distance between the second side surface and the diode interface is long, the crystal defects that exist in the second side surface are prevented from interfering with the diode interface even if the crystal defects that exist in the second side surface spread to the deep site. Moreover, although the distance between the first side surface and the diode interface is short, the crystal defects that exist in the first side surface are distributed only in the vicinity of the first side surface, and hence are prevented from interfering with the diode interface. Moreover, since the distance between the first side surface and the diode interface is short, the semiconductor device can be downsized.

Further, a method of manufacturing a semiconductor device is proposed. The method may comprise: forming a plurality of semiconductor devices in a gallium oxide substrate; and dividing the plurality of semiconductor devices from each other by dicing the gallium oxide substrate, wherein each of the divided semiconductor devices comprises an electrode in contact with an upper surface of the gallium oxide substrate, the gallium oxide substrate of each divided semiconductor device comprises: a diode interface constituted of a pn interface or a Schottky interface; and an n-type drift region connected to the electrode via the diode interface, the dicing of the gallium oxide substrate comprises: a first process of cutting the gallium oxide substrate along first dicing lines extending along a (100) plane; and a second process of cutting the gallium oxide substrate along second dicing lines extending along a plane other than the (100) plane, and a shortest distance between a cut surface at the first process and the diode interface is shorter than a shortest distance between a cut surface at the second process and the diode interface.

Either of the first and second processes may be performed prior to the other.

Cleavage is less likely to occur in the second process of cutting the gallium oxide substrate along the second dicing lines extending along the plane other than the (100) plane, so that crystal defects spread from the cut surface to a site relatively apart therefrom. However, since the distance between the cut surface and the diode interface is long, mutual interference of the crystal defects and the diode interface is prevented. Moreover, cleavage is prone to occur in the first process of cutting the gallium oxide substrate along the first dicing lines extending along the (100) plane, so that crystal defects are formed only in the vicinity of the cut surface. Due to this, even if the distance between the cut surface and the diode interface is short, mutual interference of the crystal defects and the diode interface is prevented. Moreover, since the distance between the cut surface in the first process and the diode interface is short, each semiconductor device can be downsized.

DETAILED DESCRIPTION

First Embodiment

Figure 1:
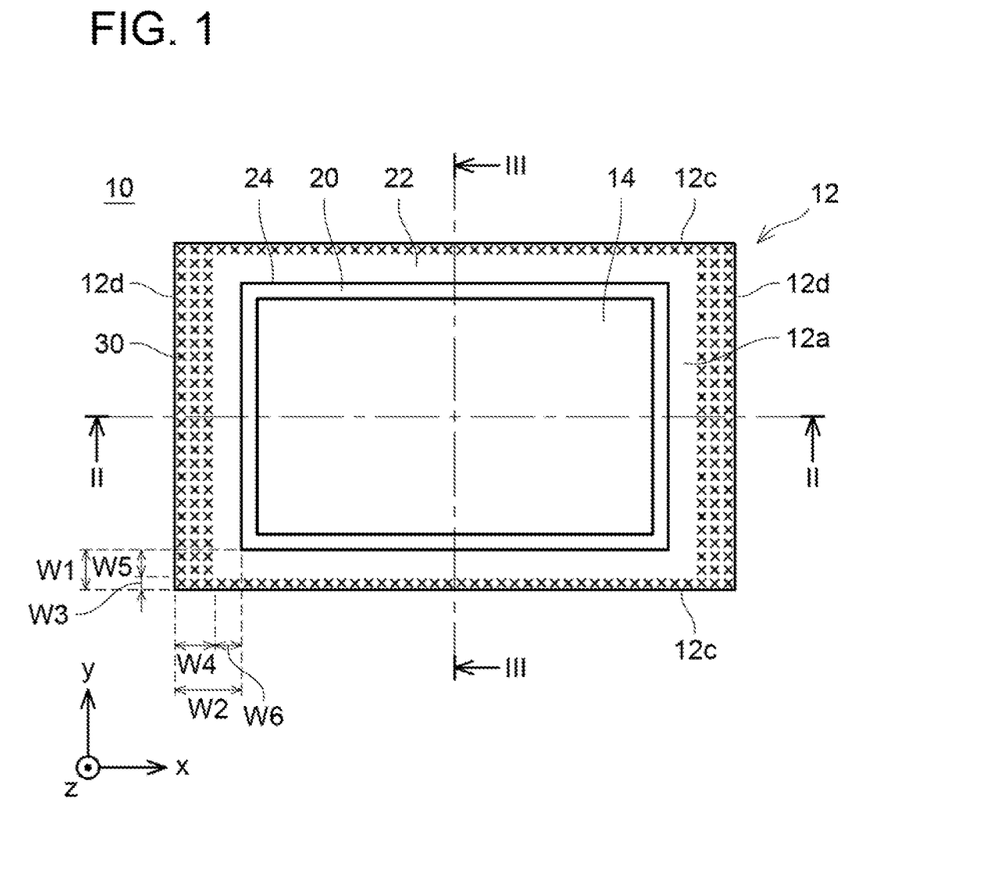
FIG. 1 is a top view of a semiconductor device in a first embodiment.
Figure 2:
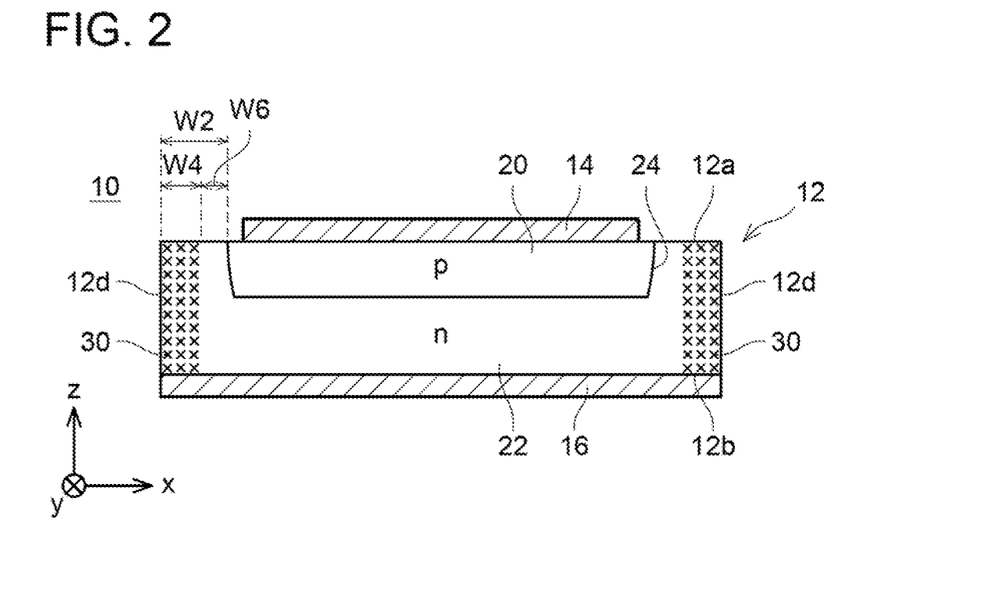
FIG. 2 is a cross-sectional view taken along a line II-II in FIG. 1.
Figure 3:
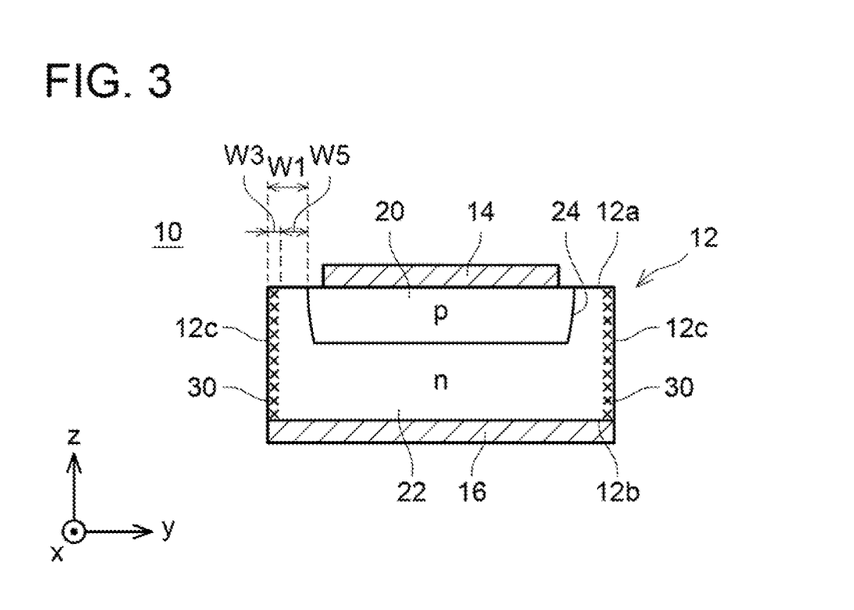
FIG. 3 is a cross-sectional view taken along a line III-III in FIG. 1.

A semiconductor device 10 in a first embodiment, shown in FIGS. 1 to 3, comprises a gallium oxide substrate 12, an anode electrode 14, and a cathode electrode 16. The anode electrode 14 is in contact with an upper surface 12a of the gallium oxide substrate 12. The anode electrode 14 covers a central portion of the upper surface 12a. The anode electrode 14 is not provided at a peripheral portion of the upper surface 12a. The cathode electrode 16 is in contact with an entirety of a lower surface 12b of the gallium oxide substrate 12. A thickness direction of the gallium oxide substrate 12 will hereinafter be termed a z direction. Moreover, a direction perpendicular to the z direction will be termed an x direction. Moreover, a direction perpendicular to both the z direction and the x direction will be termed a y direction.

The gallium oxide substrate 12 is rectangular in plan view of the upper surface 12a. The gallium oxide substrate 12 has first side surfaces 12c extending along the x direction in the plan view of the upper surface 12a, and second side surfaces 12d extending along the y direction in the plan view of the upper surface 12a. A gallium oxide crystal that constitutes the gallium oxide substrate 12 has a monoclinic crystal structure. Each of the first side surfaces 12c is a (100) plane of the gallium oxide crystal that constitutes the gallium oxide substrate 12. Namely, the y direction is a [100] direction and each first side surface 12c is the (100) plane perpendicular to the y direction that is the [100] direction. Each of the second side surfaces 12d is a plane different from the (100) plane. For example, each second side surface 12d may be a plane offset from a (001) plane by a certain angle. The upper surface 12a and the lower surface 12b are planes different from the (100) plane. For example, each of the upper surface 12a and the lower surface 12b may be a (010) plane, or may be a plane offset from the (010) plane by a certain angle.

The gallium oxide substrate 12 includes a p-type anode region 20 and an n-type drift region 22. The anode region 20 is located in a range including the upper surface 12a of the gallium oxide substrate 12. The anode region 20 is in contact with the anode electrode 14 at the central portion of the upper surface 12a. The drift region 22 is in contact with the anode region 20. The drift region 22 is located in a range traversing over from a lateral side to an underside of the anode region 20. The drift region 22 is exposed at the peripheral portion of the upper surface 12a of the gallium oxide substrate 12. The drift region 22 is in contact with the cathode electrode 16 at an entirety of the lower surface 12b of the gallium oxide substrate 12. An interface between the anode region 20 and the drift region 22 is a pn junction 24. In other words, the drift region 22 is connected to the anode electrode 14 via the pn junction 24 and the anode region 20.

The pn junction 24 forms a diode. As mentioned above, the anode region 20 is provided at the central portion of the upper surface 12a of the gallium oxide substrate 12, and the drift region 22 is provided at the peripheral portion of the upper surface 12a, and thus the pn junction 24, as shown in FIG. 1, extends in a ring shape at the upper surface 12a. The pn junction 24 extends so as to surround the anode electrode 14 at the upper surface 12a.

As shown in FIGS. 1 and 3, a spacing W1 is provided between the pn junction 24 and each first side surface 12c. As shown in FIGS. 1 and 2, a spacing W2 is provided between the pn junction 24 and each second side surface 12d. The spacing W2 is wider than the spacing W1.

Although these are to be mentioned below in details, the first side surfaces 12c and the second side surfaces 12d are cut surfaces formed by dicing of the gallium oxide substrate 12 having a wafer shape. The first side surfaces 12c and the second side surfaces 12d thus have crystal defects 30 that were formed at the dicing. The gallium oxide substrate 12 tends to cleave on the (100) plane. The crystal defects 30 are thus less likely to occur, at the dicing, in each of the first side surfaces 12c, which is formed by the dicing along the (100) plane. Each first side surface 12c thus has the crystal defects 30 only in a shallow range that is in vicinity of the first side surface 12c. Therefore, a width W3 (see FIGS. 1 and 3) of a range where the crystal defects 30 exist in vicinity of each first side surface 12c is narrow. On the other hand, the gallium oxide substrate 12 is less likely to cleave on planes other than the (100) plane. The crystal defects 30 are thus prone to occur, at the dicing, in the second side surfaces 12d. Each of the second side surfaces 12d thus has the crystal defects 30 distributed from the second side surface 12d to a deep site. Therefore, a width W4 (see FIGS. 1 and 2) of a range where the crystal defects 30 exist in vicinity of each second side surface 12d is wide. Namely, the width W4 is wider than the width W3.

The spacing W1 between the pn junction 24 and each first side surface 12c is wider than the width W3 of the range where the crystal defects 30 exist in each first side surface 12c. The spacing W2 between the pn junction 24 and each second side surface 12d is wider than the width W4 of the range where the crystal defects 30 exist in each second side surface 12d.

When the crystal defects 30 interfere with the pn junction 24, it could damage to properties of the diode such as a decreased withstand voltage and an increased leakage current in the diode, for example. As mentioned above, the spacing W2 between each second side surface 12d and the pn junction 24 is wide. Since the width W4 of the range where the crystal defects 30 exist is wide in vicinity of each second side surface 12d, allowing the spacing W2 between each second side surface 12d and the pn junction 24 to be wide ensures a sufficiently wide spacing W6 (see FIGS. 1 and 2) between the pn junction 24 and the crystal defects 30 formed in each second side surface 12d. On the other hand, as mentioned above, the spacing W1 between each first side surface 12c and the pn junction 24 is narrow. However, since the width W3 of the range where the crystal defects 30 exist is narrow in vicinity of each first side surface 12c, even though the narrow spacing W1 between each first side surface 12c and the pn junction 24 is narrow, a sufficiently wide spacing W5 (see FIGS. 1 and 3) can be ensured between the pn junction 24 and the crystal defects 30 formed in each first side surface 12c. As such, a sufficient spacing can be ensured between the crystal defects 30 and the pn junction 24 in both in vicinity of the first side surface 12c and in vicinity of the second side surface 12d. This can prevent the interference of the crystal defects 30 and the pn junction 24, and thus can prevent damage to the properties of the diode. Moreover, this configuration enables the spacing W1 between each first side surface 12c and the pn junction 24 to be narrow, and hence enables downsizing of the semiconductor device 10.

Figure 4:
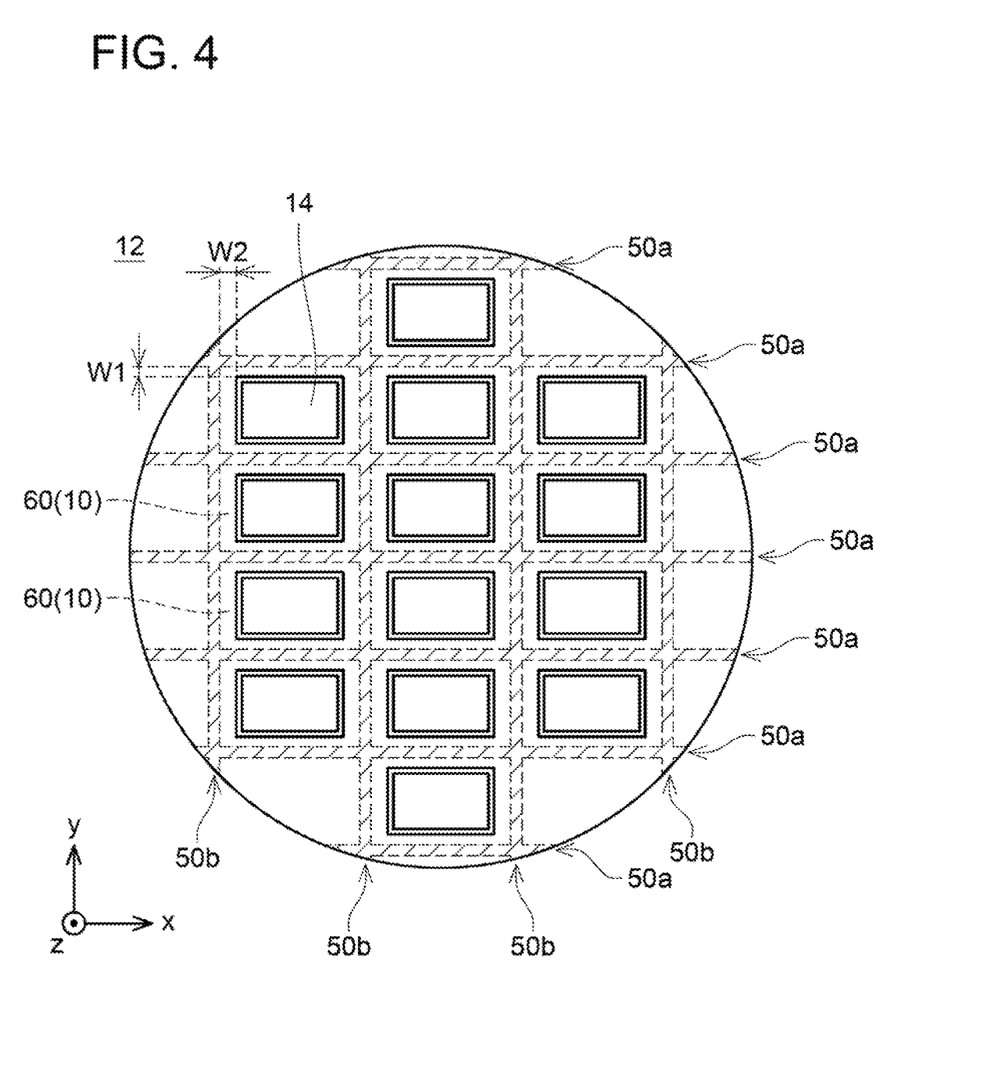
FIG. 4 is a top view of a wafer-like gallium oxide substrate used for manufacturing the semiconductor device in FIG. 1.

Next, manufacturing of the semiconductor device 10 will be described. FIG. 4 shows a wafer-like gallium oxide substrate 12 (i.e., the gallium oxide substrate 12 before dicing). An entirety of the gallium oxide substrate 12, before being subjected to processing, is constituted of the n-type drift region 22. FIG. 4 shows dicing lines 50a, 50b (regions where mechanical sawing is performed in a dicing process mentioned below) by diagonal hatching. Moreover, each of regions surrounded by the dicing lines 50a, 50b in FIG. 4 is an element region 60 where a semiconductor device 10 is to be formed. Initially, a structure of the semiconductor device 10 is formed in each element region 60. Namely, the anode region 20, the anode electrode 14, and the cathode electrode 16 are formed in each element region 60.

Next, the gallium oxide substrate 12 is sawn along the dicing lines 50a with a dicing blade. Subsequently, the gallium oxide substrate 12 is sawn along the dicing lines 50b with the dicing blade. The dicing along the dicing lines 50b may be performed prior to the dicing along the dicing lines 50a. The dicing, thus performed, divides the gallium oxide substrate 12 into a plurality of chips. Namely, each semiconductor device 10 is formed into a chip by separating the plural semiconductor devices 10 from each other. Each of the semiconductor devices 10 shown in FIGS. 1 to 3 is thereby completed. The cut surfaces obtained by the dicing along the dicing lines 50a become the first side surfaces 12c, and the cut surfaces obtained by the dicing along the dicing lines 50b become the second side surfaces 12d. Each of the dicing lines 50a extends along the (100) plane. Accordingly, each of the cut surfaces obtained by the dicing along the dicing lines 50a (i.e., the first side surfaces 12c) becomes the (100) plane. Since the dicing lines 50a extend along the (100) plane, the dicing along the dicing lines 50a is prone to cause cleavage. Cut surfaces at that occasion (i.e., the first side surfaces 12c) are thus less likely to have the crystal defects 30 formed therein. Therefore, as shown in FIGS. 1 and 3, the width W3 of the range where the crystal defects 30 exist is narrow in vicinity of each first side surface 12c. On the other hand, the dicing along the dicing lines 50b is less prone to cause cleavage. Cut surfaces at that occasion (i.e., the second side surfaces 12d) are thus likely to have the crystal defects 30 formed therein. Therefore, as shown in FIGS. 1 and 2, the width W4 of the range where the crystal defects 30 exist is wide in vicinity of each second side surface 12d.

Moreover, as shown in FIG. 4, the spacing W1 between each dicing line 50a and the pn junction 24 is narrower than the spacing W2 between each dicing line 50b and the pn junction 24. Therefore, as shown in FIG. 1, the spacing W1 between the pn junction 24 and the cut surface obtained by the cutting along each dicing line 50a (i.e., each first side surface 12c) is narrower than the spacing W2 between the pn junction 24 and the cut surface obtained by the cutting along each dicing line 50b (i.e., each second side surface 12d). As mentioned above, even with the narrow spacing W1, a sufficient spacing can be ensured between the crystal defects 30 and the pn junction 24 in both in vicinity of each first side surface 12c and in vicinity of each second side surface 12d. Therefore, this manufacturing method can prevent the interference of the crystal defects 30 and the pn junction 24. Moreover, since the spacing W1 between each first side surface 12c and the corresponding pn junction 24 can be made narrow, each semiconductor device 10 can be downsized. Therefore, this manufacturing method enables manufacturing of many semiconductor devices 10 from a single, wafer-like gallium oxide substrate 12.

Figure 5:
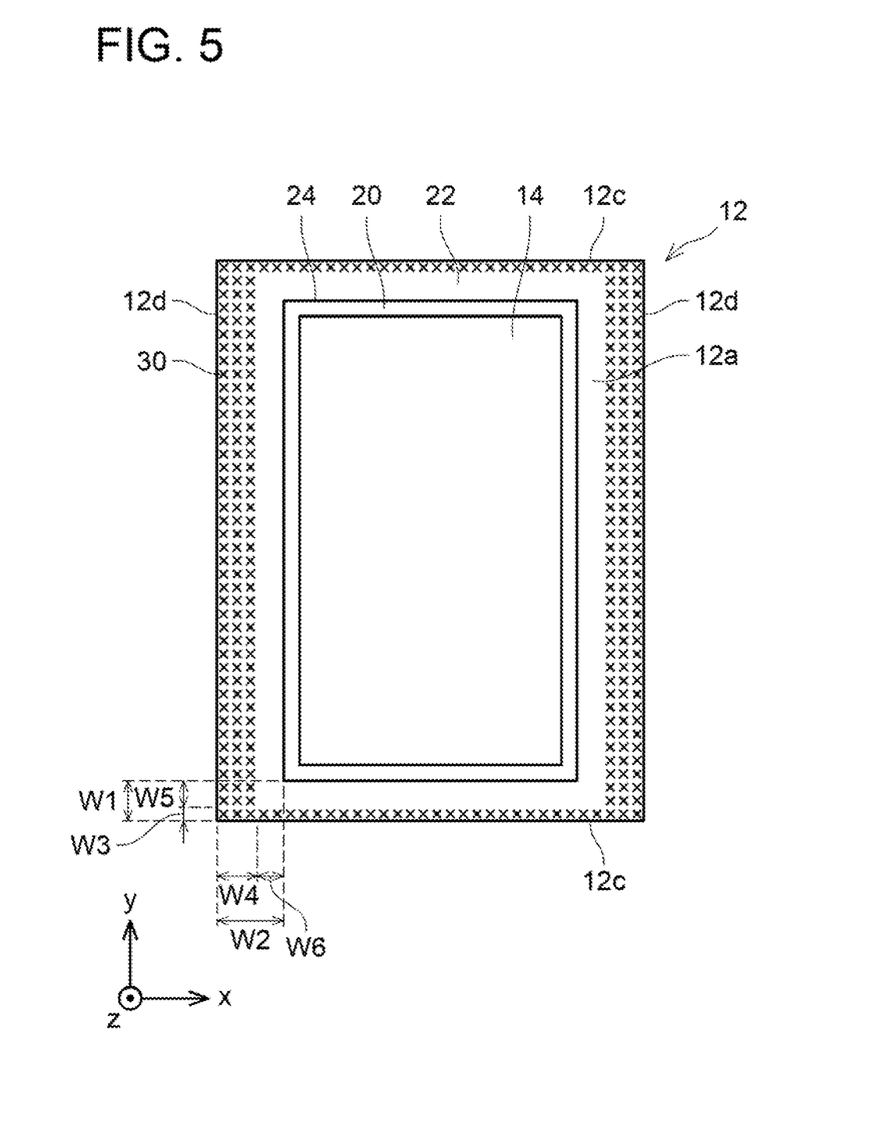
FIG. 5 is a top view of a semiconductor device in a variation of the first embodiment.
Figure 6:
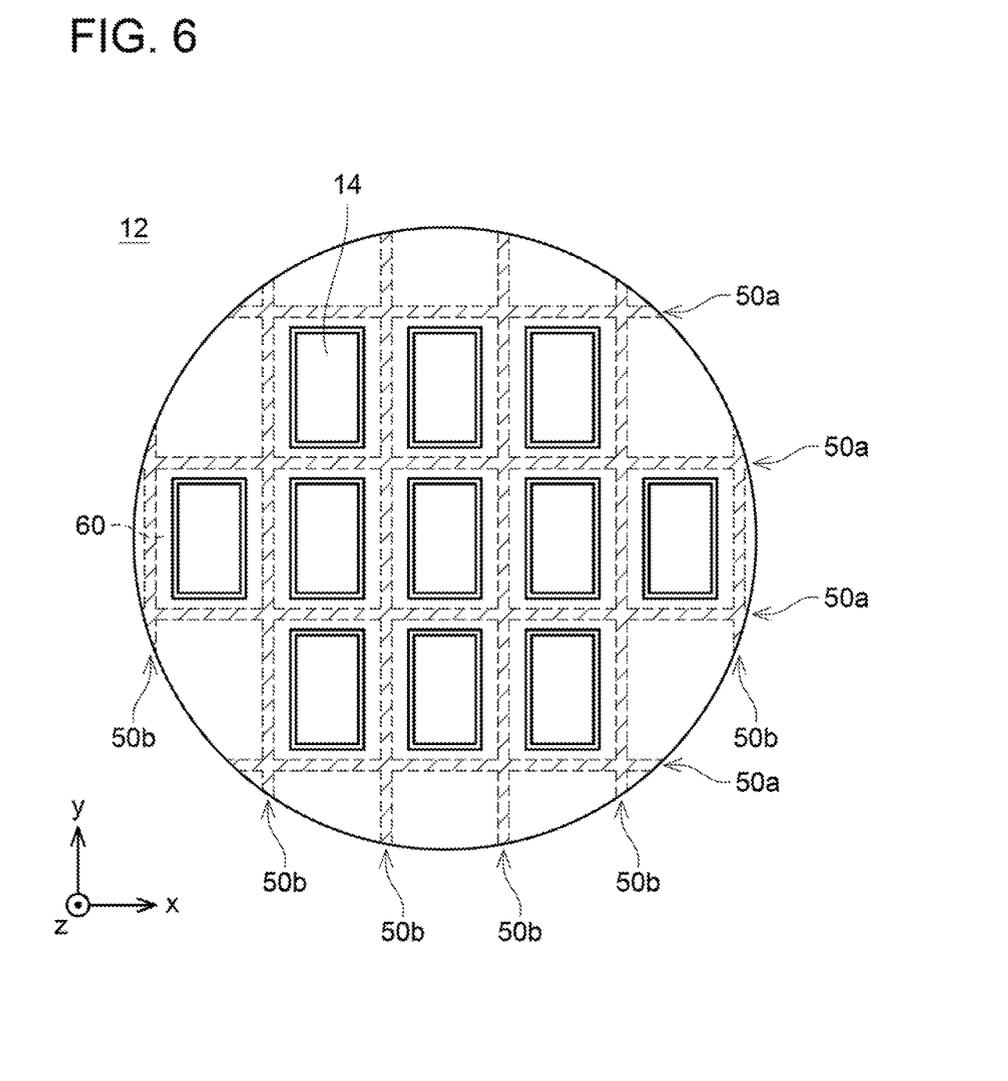
FIG. 6 is a top view of a wafer-like gallium oxide substrate used for manufacturing the semiconductor device in FIG. 5.

As shown in FIG. 1, in the semiconductor device 10 in the first embodiment, a length of each first side surface 12c, which is the (100) plane, is longer than a length of each second side surface 12d in the plan view of the upper surface 12a of the gallium oxide substrate 12. However, the length of each first side surface 12c may be shorter than the length of each second side surface 12d. Alternatively, the length of each first side surface 12c may be equal to the length of each second side surface 12d. For example, FIG. 5 shows a case where the length of each first side surface 12c is shorter than the length of each second side surface 12d in the plan view of the upper surface 12a of the gallium oxide substrate 12. In this case, since a region where the crystal defects 30 exist in vicinity of each second side surface 12d (i.e., the region of the width W4) occupies a large area in the semiconductor device 10, the size of each semiconductor device becomes larger than that in the case in FIG. 1. Moreover, in this case, as shown in FIG. 6, when plural semiconductor devices are formed in a wafer-like gallium oxide substrate 12, a number of the dicing lines 50b increases, and an area of the region where the crystal defects 30 occur increases. This reduces a number of the semiconductor devices that can be manufactured from the single, wafer-like gallium oxide substrate 12. As shown in FIG. 1, if the length of each first side surface 12c is longer than the length of each second side surface 12d, the number of the dicing lines 50a becomes greater than the number of the dicing lines 50b as shown in FIG. 4. This enables further downsizing of each semiconductor device 10, and more efficient manufacturing of the semiconductor devices 10. Moreover, allowing each first side surface 12c (i.e., the (100) plane) to be long as shown in FIG. 1, can increase a mechanical strength of each semiconductor device 10.

Second Embodiment

Figure 7:
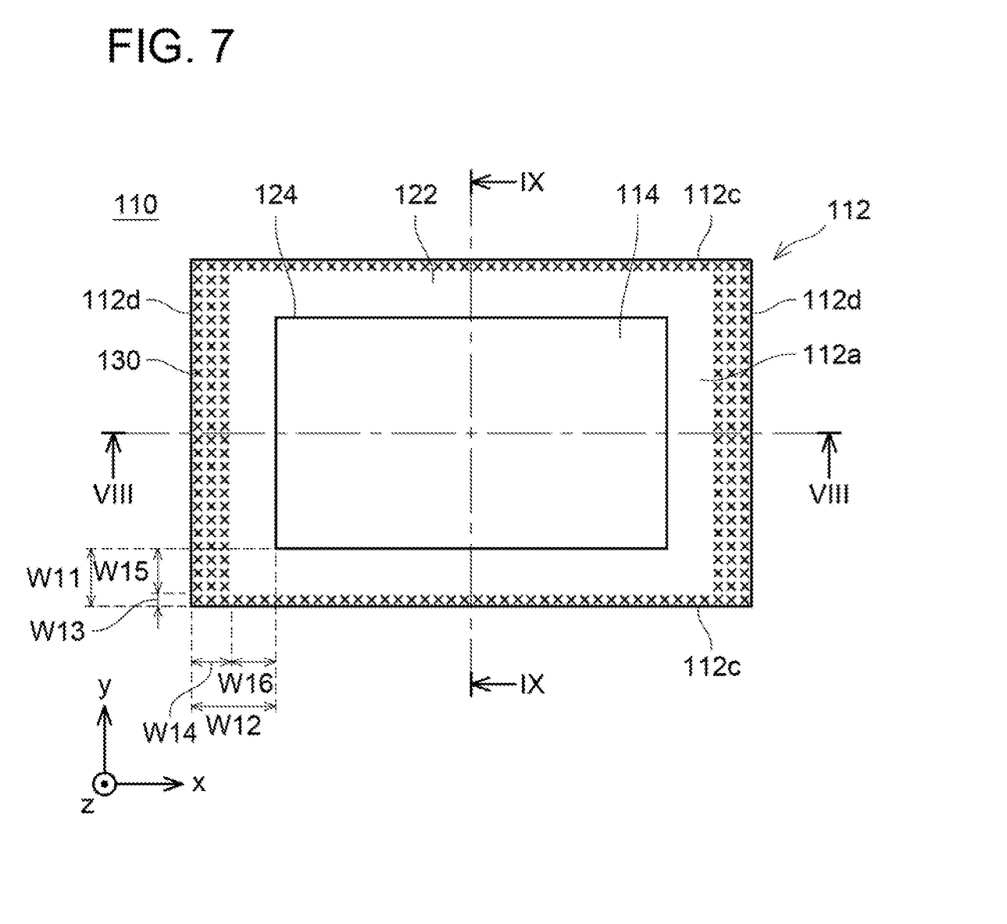
FIG. 7 is a top view of a semiconductor device in a second embodiment.
Figure 8:
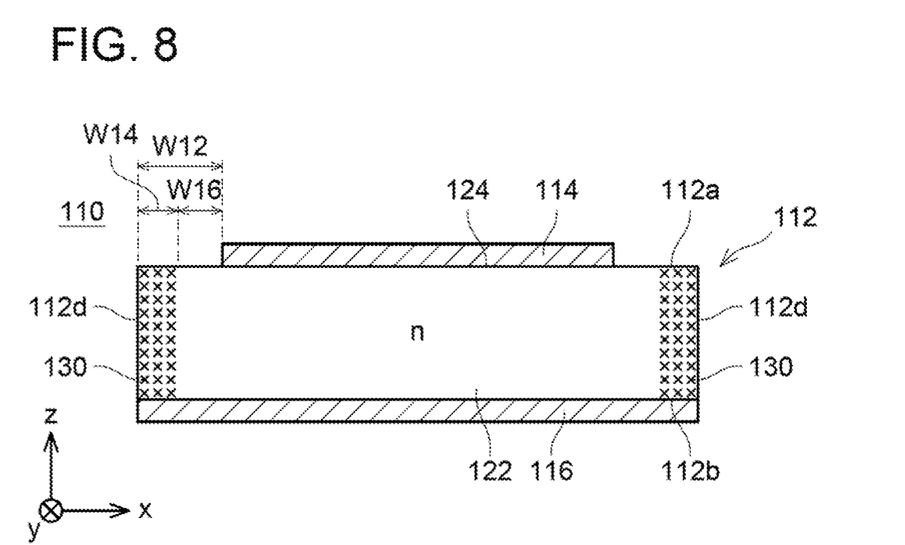
FIG. 8 is a cross-sectional view taken along a line VIII-VIII in FIG. 7.
Figure 9:
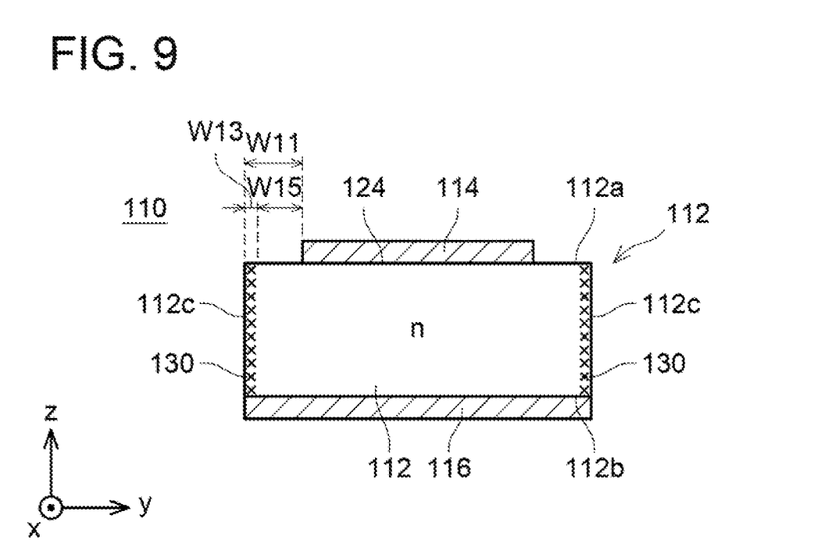
FIG. 9 is a cross-sectional view taken along a line IX-IX in FIG. 7.

A semiconductor device 110 in a second embodiment, shown in FIGS. 7 to 9, includes a gallium oxide substrate 112, an anode electrode 114, and a cathode electrode 116. The anode electrode 114 is in contact with an upper surface 112a of the gallium oxide substrate 112. The anode electrode 114 covers a central portion of the upper surface 112a. The anode electrode 114 is not provided at a peripheral portion of the upper surface 112a. The cathode electrode 116 is in contact with an entirety of a lower surface 112b of the gallium oxide substrate 112.

The gallium oxide substrate 112 is rectangular in plan view of the upper surface 112a. The gallium oxide substrate 112 has first side surfaces 112c extending along the x direction in the plan view of the upper surface 112a, and second side surfaces 112d extending along the y direction in the plan view of the upper surface 112a. Each first side surface 112c is a (100) plane of a gallium oxide crystal that constitutes the gallium oxide substrate 112. Each second side surface 112d is a plane offset relative to a (001) plane by a certain angle. Each of the upper surface 112a and the lower surface 112b is a plane offset relative to a (010) plane by a certain angle.

The gallium oxide substrate 112 includes an n-type drift region 122. The drift region 122 is in contact with the anode electrode 114 at the central portion of the upper surface 112a. The drift region 122 is exposed at the peripheral portion of the upper surface 112a of the gallium oxide substrate 112. The drift region 122 is in contact with the cathode electrode 116 at the entirety of the lower surface 112b of the gallium oxide substrate 112. An interface between the anode electrode 114 and the drift region 122 is a Schottky junction 124. In other words, the drift region 122 is connected to the anode electrode 114 via the Schottky junction 124. The Schottky junction 124 forms a diode.

A spacing W11 is provided between the Schottky junction 124 and each first side surface 112c (i.e., between the anode electrode 114 and each first side surface 112c). Moreover, a spacing W12 is provided between the Schottky junction 124 and each second side surface 112d. The spacing W12 is wider than the spacing W11.

Although these will be mentioned below in details, the first side surfaces 112c and the second side surfaces 112d are cut surfaces formed by dicing of a gallium oxide substrate 112 having a wafer shape. The first side surfaces 112c and the second side surfaces 112d thus have crystal defects 130 that were formed at the dicing. The first side surfaces 112c (the cut surfaces along the (100) plane) are less prone to have the crystal defects 130 formed therein. The first side surfaces 112c thus have the crystal defects 130 only in a shallow range in vicinity of the first side surfaces 112c. Therefore, a width W13 (see FIGS. 7 and 9) of a range where the crystal defects 130 exist in vicinity of each first side surface 112c is narrow. The second side surfaces 112d (cut surfaces not along the (100) plane) are likely to have the crystal defects 130 formed therein. Each second side surface 112d thus has the crystal defects 130 distributed from the second side surface 112d to a deep site. Therefore, a width W14 (see FIGS. 7 and 8) of a range where the crystal defects 130 exist in vicinity of each second side surface 112d is wide. Namely, the width W14 is wider than the width W13.

The spacing W11 between the Schottky junction 124 and each first side surface 112c is wider than the width W13 of the range where the crystal defects 130 exist in each first side surface 112c. The spacing W12 between the Schottky junction 124 and each second side surface 112d is wider than the width W14 of the range where the crystal defects 130 exist in each second side surface 112d.

If the crystal defects 130 interfere with the Schottky junction 124, it would cause damage to properties of the diode such as a decreased withstand voltage and an increased leakage current in the diode, for example. As mentioned above, the spacing W12 between each second side surface 112d and the Schottky junction 124 is wide. Since the width W14 of the range where the crystal defects 130 exist is wide in vicinity of each second side surface 112d, allowing the spacing W12 between each second side surface 112d and the Schottky junction 124 to be wide ensures a sufficiently wide spacing W16 (see FIGS. 7 and 8) between the Schottky junction 124 and the crystal defects 130 that exist in each second side surface 112d. On the other hand, as mentioned above, the spacing W11 between each first side surface 112c and the Schottky junction 124 is narrow. However, since the width W13 of the range where the crystal defects 130 exist is narrow in vicinity of each first side surface 112c, even though the spacing W11 between each first side surface 112c and the Schottky junction 124 is narrow, a sufficiently wide spacing W15 (see FIGS. 7 and 9) can be ensured between the Schottky junction 124 and the crystal defects 130 that exist in each first side surface 112c. As such, a sufficient spacing can be ensured between the crystal defects 130 and the Schottky junction 124 both in vicinity of each first side surface 112c and in vicinity of each second side surface 112d. This can prevent the interference of the crystal defects 130 and the Schottky junction 124, and thus can prevent damage to properties of the diode. Moreover, this configuration enables the spacing W11 between each first side surface 112c and the Schottky junction 124 to be narrow, and hence enables downsizing of the semiconductor device 110.

Figure 10:
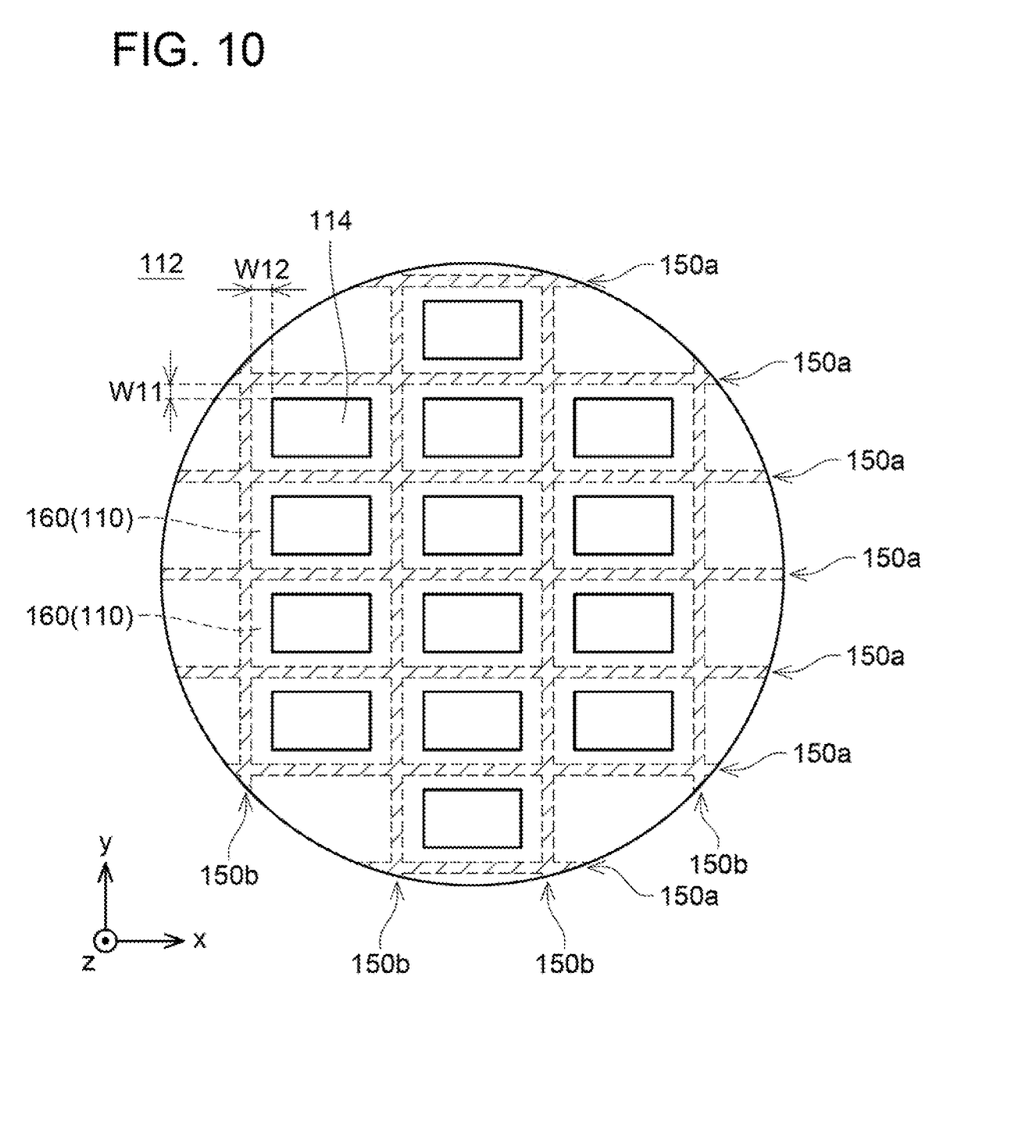
FIG. 10 is a top view of a wafer-like gallium oxide substrate used for manufacturing the semiconductor device in FIG. 7.

Next, manufacturing of semiconductor devices 110 will be described. FIG. 10 shows a wafer-like gallium oxide substrate 112 (i.e., the gallium oxide substrate 112 before dicing). An entirety of the gallium oxide substrate 112, before being subjected to processing, is constituted of the n-type drift region 122. FIG. 10 shows dicing lines 150a, 150b (regions where mechanical sawing is performed in a dicing process mentioned below) by diagonal hatching. Moreover, each of regions surrounded by the dicing lines 150a, 150b in FIG. 10 is an element region 160 where one semiconductor device 110 is to be formed. Initially, a structure of the semiconductor device 110 is formed in each element region 160. Namely, the anode electrode 114 and the cathode electrode 116 are formed in each element region 160.

Next, the gallium oxide substrate 112 is sawn along the dicing lines 150a with a dicing blade. Next, the gallium oxide substrate 112 is sawn along the dicing lines 150b with the dicing blade. Here, the dicing along the dicing lines 150b may be performed prior to the dicing along the dicing lines 150a. The dicing, thus performed, divides the gallium oxide substrate 112 into a plurality of chips. Namely, each semiconductor device 110 is formed into a chip by dividing the plural semiconductor devices 110 from each other. Each of the semiconductor devices 110 shown in FIGS. 7 to 9 is thereby completed. Cut surfaces obtained by the dicing along the dicing lines 150a become the first side surfaces 112c, and cut surfaces obtained by the dicing along the dicing lines 150b become the second side surfaces 112d. When the dicing is performed along the dicing lines 150a (i.e., the (100) plane), cleavage tends to occur and the crystal defects 130 are less likely to be formed. The first side surfaces 112c are thus less likely to have the crystal defects 130 formed therein. Therefore, as shown in FIGS. 7 and 9, the width W13 of the range where the crystal defects 130 exist is narrow in vicinity of each first side surface 112c. On the other hand, when the dicing is performed along the dicing lines 150b, cleavage is less likely to occur. The resultant cut surfaces (i.e., the second side surfaces 112d) thus are likely to have the crystal defects 130 formed therein. Therefore, as shown in FIGS. 7 and 8, the width W14 of the range where the crystal defects 130 exist is wide in vicinity of each second side surface 112d.

Moreover, as shown in FIG. 10, the spacing W11 between each dicing line 150a and the Schottky junction 124 is narrower than the spacing W12 between each dicing line 150b and the Schottky junction 124. Therefore, as shown in FIG. 7, the spacing W11 between the Schottky junction 124 and the cut surfaces obtained by the cutting along each dicing line 150a (i.e., each first side surface 112c) is narrower than the spacing W12 between the Schottky junction 124 and the cut surfaces obtained by the cutting along each dicing line 150b (i.e., each second side surface 112d). As mentioned above, even with the narrow width W11, a sufficient spacing can be ensured between the crystal defects 130 and the Schottky junction 124 both in vicinity of each first side surface 112c and in vicinity of each second side surface 112d. Therefore, this manufacturing method can prevent the interference of the crystal defects 130 and the Schottky junction 124. Moreover, since the spacing W11 between each first side surface 112c and the Schottky junction 124 can be made narrow, each semiconductor device 110 can be downsized. Therefore, this manufacturing method enables manufacturing of many semiconductor devices 110 from the single, wafer-like gallium oxide substrate 112.

Notably, as shown in FIG. 7, in the semiconductor device 110 in the second embodiment, a length of each first side surface 112c, which is the (100) plane, is longer than a length of each second side surface 112d in the plan view of the upper surface 112a of the gallium oxide substrate 112. However, the length of each first side surface 112c may be shorter than the length of each second side surface 112d. Alternatively, the length of each first side surface 112c may be equal to the length of each second side surface 112d. For example, in a semiconductor device that includes the Schottky junction 124, the length of each first side surface may be shorter than the length of each second side surface as shown in FIGS. 5 and 6. It should be noted, in this case, that the size of each semiconductor device becomes larger than that in the case in FIG. 7. Allowing the length of each first side surface 112c to be longer than the length of each second side surface 112d, as in FIG. 7, enables further downsizing of each semiconductor device 110, and more efficient manufacturing of the semiconductor devices 110. Moreover, allowing each first side surface 112c (i.e., the (100) plane) to be long, as in FIG. 7, can increase a mechanical strength of each semiconductor device 110.

In the above-mentioned first and second embodiments, each of the first and second side surfaces extends approximately parallel to a peripheral edge of the diode interface (i.e., the pn junction 24 or the Schottky junction 124). However, the distance between each first side surface and the diode interface may vary depending on sites, and the distance between each second side surface and the diode interface may vary depending on sites. In this case, a shortest distance between each first side surface and the diode interface can be made shorter than a shortest distance between each second side surface and the diode interface. This configuration, like those in the first and second embodiments, can also prevent the interference of the crystal defects and the diode interface while downsizing each semiconductor device.

Moreover, in each of the above-mentioned first and second embodiments, the diode is formed in the gallium oxide substrate. However, another element including the pn junction 24 or the Schottky junction 124 (e.g., a field effect transistor (FET)) may be formed.

Some of the features disclosed herein will be listed below. It should be noted that the respective technical elements are independent of one another, and are useful.

In an example of the semiconductor device disclosed herein, the gallium oxide substrate may comprise a p-type anode region in contact with the electrode and the drift region. The diode interface may be an interface between the anode region and the drift region. Further, in another example of the semiconductor device disclosed herein, the drift region may be in Schottky contact with the electrode. The diode interface may be an interface between the electrode and the drift region.

In an example of the semiconductor device disclosed herein, a length of the first side surface may be longer than a length of the second side surface in plan view of the upper surface of the gallium oxide substrate.

The above configuration allows further downsizing of the semiconductor device.

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

What is claimed is:

1. A semiconductor device comprising:
    a gallium oxide substrate comprising a first side surface constituted of a (100) plane, a second side surface constituted of a plane other than the (100) plane, and an upper surface; and
    an electrode in contact with the upper surface,
    wherein
    the gallium oxide substrate comprises:
        a diode interface constituted of a pn interface or a Schottky interface; and
        an n-type drift region connected to the electrode via the diode interface, and
    a shortest distance between the first side surface and the diode interface is shorter than a shortest distance between the second side surface and the diode interface.

2. The semiconductor device of claim 1, wherein
    the gallium oxide substrate comprises a p-type anode region in contact with the electrode and the drift region, and
    the diode interface is an interface between the anode region and the drift region.

3. The semiconductor device of claim 1, wherein
    the drift region is in Schottky contact with the electrode, and
    the diode interface is an interface between the electrode and the drift region.

4. The semiconductor device of claim 1, wherein a length of the first side surface is longer than a length of the second side surface in plan view of the upper surface of the gallium oxide substrate.

5. The semiconductor device of claim 2, wherein the diode interface extends so as to surround the electrode at the upper surface.

* * * * *